(12) United States Patent
Halope

(10) Patent No.: US 6,908,786 B2
(45) Date of Patent: Jun. 21, 2005

(54) METHOD FOR PRODUCING A CONTACTLESS CHIP CARD USING TRANSFER PAPER

(75) Inventor: Christophe Halope, Golfe Juan (FR)

(73) Assignee: Ask S.A., Valbonne-Sophia Antipolis (FR)

(*) Notice: Subject to any disclaimer, the term of this patent is extended or adjusted under 35 U.S.C. 154(b) by 259 days.

(21) Appl. No.: 10/333,022

(22) PCT Filed: May 14, 2002

(86) PCT No.: PCT/FR02/01625
§ 371 (c)(1),
(2), (4) Date: Jan. 15, 2003

(87) PCT Pub. No.: WO02/093472
PCT Pub. Date: Nov. 21, 2002

(65) Prior Publication Data
US 2003/0153120 A1 Aug. 14, 2003

(30) Foreign Application Priority Data
May 16, 2001 (FR) .......................... 01 06480

(51) Int. Cl.$^7$ .................. H01L 21/44; H01L 21/48; H01L 21/50
(52) U.S. Cl. .............. 438/106; 438/106; 438/125; 438/126
(58) Field of Search ................. 438/106, 125, 438/126; 257/679

(56) References Cited

U.S. PATENT DOCUMENTS

| 4,722,765 A | * | 2/1988 | Ambros et al. .............. 216/16 |
| 5,852,289 A | * | 12/1998 | Masahiko .................. 235/492 |
| 5,937,512 A | * | 8/1999 | Lake et al. .................. 29/832 |
| 6,517,005 B1 | * | 2/2003 | Ayala ........................ 235/492 |
| 6,595,426 B1 | * | 7/2003 | Brunet et al. ............... 235/487 |
| 6,768,415 B1 | * | 7/2004 | Tuttle ....................... 340/10.4 |
| 6,774,470 B2 | * | 8/2004 | Yagi et al. .................. 257/679 |
| 6,786,419 B2 | * | 9/2004 | Kayanakis .................. 35/492 |
| 2003/0164611 A1 | * | 9/2003 | Schneider et al. ........... 283/57 |
| 2004/0219714 A1 | * | 11/2004 | Yagi et al. ................... 438/106 |

FOREIGN PATENT DOCUMENTS

| EP | 0 920 056 | 6/1999 |
| WO | WO 00/22673 | 4/2000 |

* cited by examiner

Primary Examiner—Michael S. Lebentritt
Assistant Examiner—Angel Roman
(74) Attorney, Agent, or Firm—James C. Lydon

(57) ABSTRACT

The invention concerns a manufacturing process for a contactless smart card (or ticket) which includes the following steps:

a manufacturing process for an antenna consisting in screen-printing turns of an electrically conductive polymer ink onto a transfer paper sheet, and then subjecting said support to heat treatment in order to bake and polymerize said conductive ink, connection of a chip 14, provided with contacts, to the antenna 12, lamination consisting in making the transfer paper sheet integral with a layer of plastic material 16 which constitutes the support for the antenna, by hot press molding, in such a way that the screen-printed antenna and the chip are both embedded within the layer of plastic material, removal of the transfer paper sheet, and lamination of the card body onto the antenna support by welding at least one layer of plastic material (18, 20) by hot press molding on each side of the support.

14 Claims, 2 Drawing Sheets

METHOD FOR PRODUCING A CONTACTLESS CHIP CARD USING TRANSFER PAPER

This application is a U.S. National Stage of International application PCT/FR02/01625, filed May 14, 2002.

TECHNICAL FIELD

This invention concerns the field of smart cards (or tickets), and more particularly a manufacturing method for a contactless smart card.

PRIOR ART

Smart cards and tickets, and more particularly ISO format cards, have become extremely widespread in recent years. Above and beyond their use as credit cards, smart cards have become indispensable tools in many areas. This growth is largely due to the fact that, in addition to the traditional use of cards which make contact with the appropriate reader (e.g. bank and telephone cards), the new cards can be used without any physical contact with the reader.

The exchange of information between the contactless card or hybrid contact-contactless card and the associated reader is accomplished by remote electromagnetic coupling between an antenna integrated into the contactless card and a second antenna located in the reader. In order to create, store and process the information, the card is provided with a chip which is connected to the antenna. The antenna is generally located on a dielectric support made of plastic material. This ease of use has made the development of many other applications possible. For example, the development of the electronic wallet. In the transportation sector, smart cards have been developed as a means of paying highway tolls. At events, smart cards can be used by supporters as a season ticket for venues. For security applications, many companies have set up systems for staff identification based on ISO contactless smart cards.

The conventional contactless cards found on the market consist of several layers of plastic material, notably polyvinyl chloride (PVC). One of these layers constitutes the support for the antenna, and the others generally constitute the body of the card. The card's antenna is most commonly a copper wire or is chemically etched onto the card.

However, the production of such cards is relatively expensive. This is because the use of copper and etching processes are both expensive. Moreover, producing such an antenna on a PVC support necessarily entails using sophisticated—and therefore expensive—machinery.

Now, the development of contactless technology is dependent on a reduction in the manufacturing costs for such cards. One way of reducing production costs involves cheaper manufacturing methods for the antenna, notably by creating it using a screen-printing process with a conductive ink.

However, screen-printing on PVC is associated with a number of drawbacks. Furthermore, PVC exhibits poor thermomechanical properties. During the card body lamination process, material flow is significant and the antenna's shape factor is not maintained. Before lamination, when the conductive ink used to create the antenna is drying, the temperature is higher than that at which the plastic material becomes soft so there is deformation of the support which affects the antenna's electrical performance. This leads to antenna malfunction as electrical parameters (inductance and resistance) vary. Even more serious, it is not uncommon to experience antenna breakage in areas where strong sheer stresses are present. Moreover, it is impossible to replace the thermoplastic material with a thermosetting one since the latter is not amenable to hot lamination.

Another disadvantage is that, when the antenna is screen-printed onto PVC, connecting the chip to the antenna is much more difficult.

DISCLOSURE OF THE INVENTION

The purpose of the invention is thus to overcome these drawbacks by proposing a manufacturing method for a contactless smart card, made of plastic, with an antenna produced by screen-printed ink, with a low cost price but which is nevertheless very reliable.

The invention thus concerns a manufacturing process for a contactless smart card (or ticket) which includes the following steps:

a manufacturing process for the antenna consisting in screen-printing turns of electrically conductive polymer ink on a transfer paper sheet, and then subjecting said support to heat treatment in order to bake and polymerize said conducting ink, connection of a chip, provided with contacts, to the antenna, lamination consisting in making the transfer paper sheet integral with a layer of plastic material which constitutes the antenna support, by hot press molding, in such a way that the screen-printed antenna and the chip are both embedded within the plastic material, removal of the transfer paper, and lamination of the card body onto the antenna support by welding on each side of the support at least one layer of plastic material by means of hot press molding.

Another object of the invention is a smart card, generated by the method according to the invention, which includes an antenna support made of a plastic material and at least one layer of plastic material on either side of the antenna support constituting the body of the card, in which both the screen-printed antenna and the chip are embedded in the antenna support.

BRIEF DESCRIPTION OF THE DRAWINGS

The purposes, objects and characteristics of the invention will become more apparent from the following description when taken in conjunction with the accompanying drawings in which.

DETAILED DESCRIPTION OF THE INVENTION

The first step of the smart card manufacturing method consists in creating an antenna on an appropriate substrate which is a sheet of transfer paper. Preferably, the antenna is produced by screen-printing a conductive ink onto this sheet of transfer paper. The screen-printed antenna consist of a series of concentric turns plus two contacts. The contacts make it possible to connect the chip to the antenna. Once the antenna has been produced, the transfer paper is heat-treated in order to bake the screen-printed ink. The ink used is a polymerizable product doped with conductive components. Preferably, it is an epoxy ink doped with particles of silver, copper or carbon.

Figure 1:
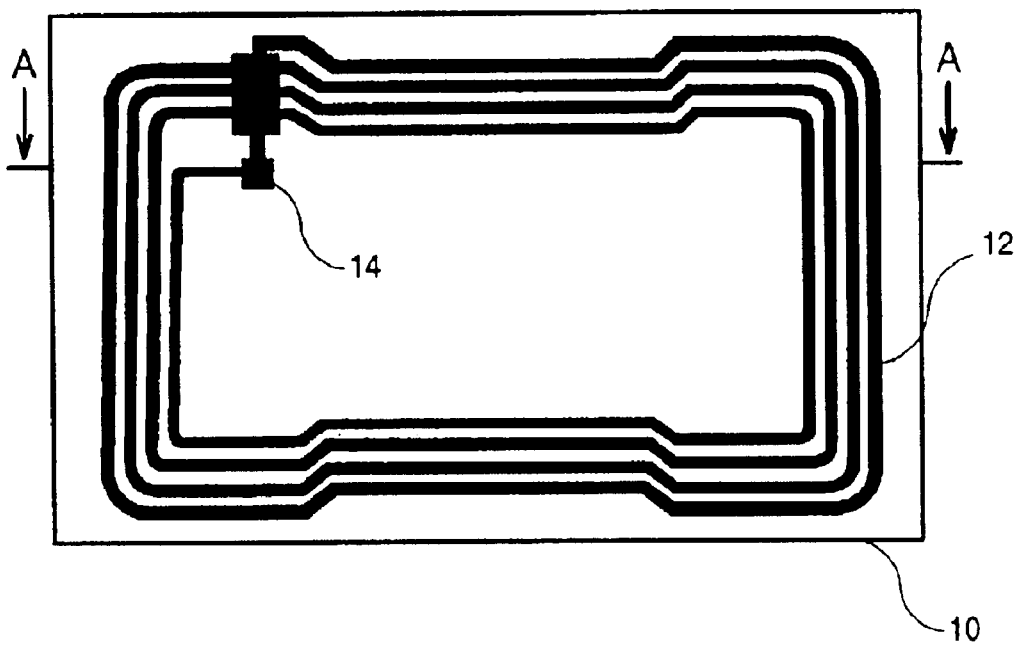
FIG. 1 shows a side view of a sheet of transfer paper bearing a screen-printed antenna and a chip connected to this antenna.

Once the antenna has been produced, the chip is connected to the antenna while it is still on the transfer paper sheet. The transfer paper sheet 10 bearing the screen-printed antenna 12 and the chip 14 (which are already connected) are shown in FIG. 1. Different methods may be used to connect the chip 14 to the antenna 12. A first embodiment includes the following steps:

- positioning the chip on the transfer paper so that the chip's contacts are located opposite the antenna's contacts, and
- exerting pressure on the chip so that its contacts deform the transfer paper and the antenna's contacts. The transfer paper sheet and the antenna's contacts remain deformed after the pressure is released, thus providing an extensive area of contact between the contacts on the chip and those on the antenna.

According to a second embodiment, connecting the chip includes the following steps:

- coating the antenna's contacts with a conductive adhesive, and
- positioning the chip on the transfer paper so that the contacts of said chip become submerged in said conductive adhesive opposite the antenna's contacts.

Figure 2:
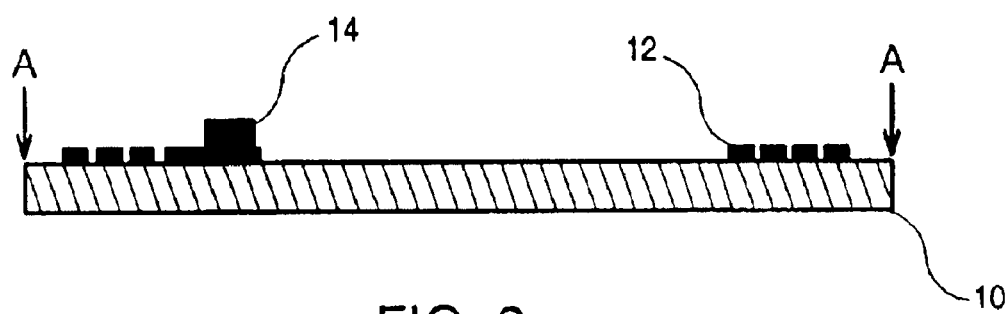
FIG. 2 shows a longitudinal section through axis A—A of the transfer paper sheet as shown in FIG. 1.

FIG. 2 shows a longitudinal section through axis A—A of the transfer paper sheet. The transfer paper sheet 10 bears the antenna 12 in the form of screen-printed turns. The chip 14 is connected to the antenna 12.

Figure 3:
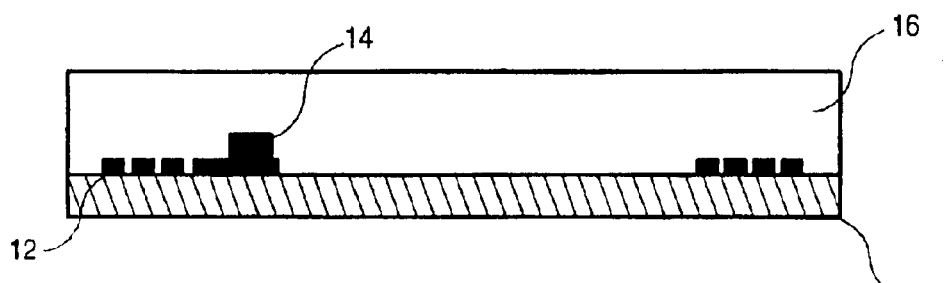
FIG. 3 shows a longitudinal section through the transfer paper sheet in contact with the plastic antenna support after a lamination step.

When the chip has been connected to the antenna, the transfer paper sheet is laminated with a sheet of plastic material which constitutes the antenna support. This lamination step is accomplished by hot press molding. FIG. 3 shows the transfer paper sheet 10 and the plastic antenna support 16. According to a preferred embodiment, the plastic material might be either PVC or PET. From FIG. 3, it can be seen that, once the lamination step has been performed, the screen-printed antenna 12 and the chip 14 are embedded in the layer of PVC 16 which constitutes the antenna support. The PVC used to make the antenna support should have a relatively high Vicat point (the temperature at which the material softens). The temperature at which it softens is preferably 85° C. The hot press molding used in the lamination step should take place at a temperature of 85° C. or above so that the PVC becomes soft. Then the chip and the antenna will sink into and become embedded within the PVC layer.

Figure 4:
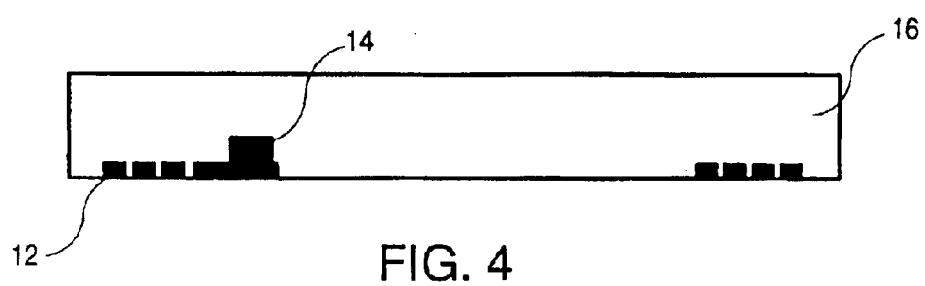
FIG. 4 shows a longitudinal section through the antenna support after removal of the transfer paper sheet.

The next step consists in removing the transfer paper sheet from the PVC antenna support. In practice, one of the properties of the transfer paper is that, when heated, it loses its adhesive characteristics and releases what it was bearing on its surface. In this case, the antenna 12 and the chip 14 remain associated with the PVC antenna support 16 as shown in FIG. 4.

The final step in the method involves laminating either side of the antenna support with at least one layer of plastic material. These layers constitute the card bodies. According to a preferred embodiment, this plastic material is either PVC, polyester (PET or PETG), polycarbonate (PC) or acrylonitrile-butadiene-styrene (ABS). Preferably, the plastic material used is PVC. This PVC—in contrast to that used for the antenna support—should have a low Vicat point. The temperature at which it becomes soft is preferably 75° C. In order to make them integral with one another, the three layers of PVC are compressed at a temperature of 75° C. The layers constituting the body of the card soften and bind the antenna support layer (which remains hard). Therefore, for the antenna support, a form of PVC with a high Vicat point has to be used so that it does not soften when the card is being laminated at a temperature corresponding to the Vicat point of the PVC used to make the card body. Deformation of the PVC which constitutes the antenna support could result in deformation or even breakage of the antenna which would render the smart card non-functional. Therefore, the temperature at which the card body is laminated is equal to or greater than the Vicat point of the PVC used to make the body of the card, but below the Vicat point of the PVC used to make the antenna support.

Figure 5:
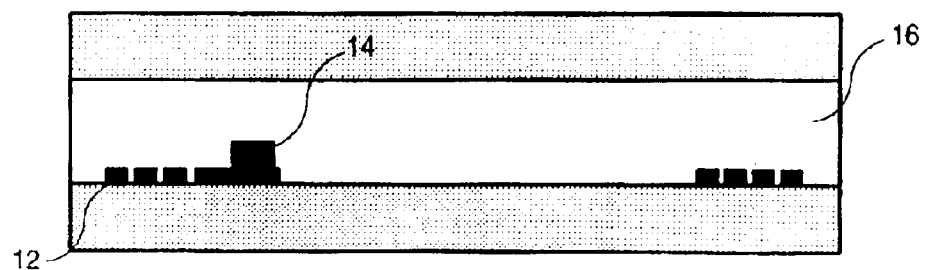
FIG. 5 shows a longitudinal section through the finished card according to the invention.

FIG. 5 shows a longitudinal cross-section through the resultant card. The antenna support integrates both the antenna 12 and the chip 14. This support is continuous with both of the components of the card body (18 and 20) located on either side of the support 16. It can be seen that this configuration efficiently protects the card's vital components, i.e. the antenna and the support, because they are completely embedded in the antenna support. Moreover, the resultant card has no extra thickness and presents neither visual artifacts on the card nor deformation of the printing which would be due to electronic components.

This manufacturing method therefore results in a card made entirely of PVC with a screen-printed antenna composed of conductive ink. The cost price of this card is in consequence very low, in contrast to that of conventional cards which are far more expensive to produce. Moreover, as a result of their configuration—notably the presence of a copper or etched antenna—conventional cards are more fragile.

What is claimed is:

1. A manufacturing method for a contactless smart card, comprising the following steps:

- creation of an antenna by screen printing turns of an electrically conductive polymer ink onto a transfer paper sheet, and then subjecting said transfer paper sheet to heat treatment in order to bake and polymerize said conductive ink,
- connection of a chip, provided with contacts, to said antenna,
- lamination of said transfer paper sheet with a layer of plastic material which constitutes the support for the antenna, by hot press molding, in such a way that said antenna and said chip are both embedded within said layer of plastic material,
- removal of said transfer paper, and
- lamination of the card body onto said antenna support by welding or sticking on either side of the support at least one layer of plastic material by means of hot press molding.

2. The method of claim 1, wherein the step of connecting the chip to said antenna comprises:

- positioning the chip on the transfer paper in such a way that the contacts of said chip are located opposite the antenna's contacts, and
- exerting pressure on said chip in such a way that said contacts deform said transfer paper and said contacts of said antenna as a result of the pressure, the deformation of said transfer paper sheet and said contacts persisting after the pressure has been lifted, thus providing an extensive area of contact between the contacts on the chip and those on the antenna.

3. The method of claim 1, wherein the step of connecting the chip to said antenna comprises:
   coating the antenna's contacts with a conductive adhesive, and
   positioning the chip on the transfer paper in such a way that the contacts of said chip become embedded in said conductive adhesive opposite the antenna's contacts.

4. The method of claim 1, wherein said antenna support is made of a plastic material.

5. The method of claim 4 wherein the plastic material has a Vicat point of 85°C.

6. The method of claim 1, wherein the plastic material forming the card body is selected from the group consisting of polyvinyl chloride (PVC), polyester (PET, PETG), polycarbonate (PC) and acrylonitrile-butadiene-styrene (ABS).

7. The method of claim 6, wherein said plastic material is PVC with a low Vicat point.

8. The method of claim 7, wherein the Vicat point is 75°C.

9. The method of claim 4, wherein the temperature at which said step of lamination of the transfer paper onto the antenna's support is performed is equal to or greater than the Vicat point of the PVC used to make said antenna support.

10. The method of claim 9, wherein the temperature at which said step of lamination of the card bodies is performed is equal to or greater than the Vicat point of the PVC used to make said card bodies, but below the Vicat point of the PVC used to make said antenna support.

11. The method of claim 1, wherein said polymerizable, conductive ink is an epoxy ink doped with conductive elements.

12. The method of claim 4, wherein said plastic material comprises PVC having a high Vicat point.

13. The method of claim 4, wherein said plastic material comprises PET.

14. The method of claim 11, wherein said conductive elements comprise particles of at least one member of the group consisting of silver, copper and carbon.

* * * * *